US006643304B1

United States Patent
Chen et al.

(10) Patent No.: US 6,643,304 B1
(45) Date of Patent: Nov. 4, 2003

(54) TRANSPARENT SUBSTRATE LIGHT EMITTING DIODE

(75) Inventors: John Chen, Los Angeles County, CA (US); Bingwen Liang, Santa Clara County, CA (US); Robert Shih, Los Angeles County, CA (US)

(73) Assignee: AXT, Inc., Fremont, CA (US)

( * ) Notice: Subject to any disclaimer, the term of this patent is extended or adjusted under 35 U.S.C. 154(b) by 227 days.

(21) Appl. No.: 09/626,444

(22) Filed: Jul. 26, 2000

(51) Int. Cl.[7] .............................. H01S 5/00; H01S 3/08; H01L 29/227
(52) U.S. Cl. ............................ 372/44; 257/98; 257/94; 372/96
(58) Field of Search .......................... 257/94, 95, 98; 372/43–50, 96, 92

(56) References Cited

U.S. PATENT DOCUMENTS

| 4,309,670 A | * | 1/1982 | Burnham et al. | ............... 372/46 |
| 5,089,860 A | * | 2/1992 | Deppe et al. | ................. 257/98 |
| 5,614,734 A | * | 3/1997 | Guido | ......................... 257/94 |
| 5,677,924 A | * | 10/1997 | Bestwick | ...................... 372/96 |
| 5,719,894 A | | 2/1998 | Jewell et al. | ................... 372/45 |
| 5,793,062 A | | 8/1998 | Kish, Jr. et al. | |
| 6,320,206 B1 | * | 11/2001 | Coman et al. | ................. 257/98 |

FOREIGN PATENT DOCUMENTS

JP 59-028394 A * 2/1984 .................. 257/98

* cited by examiner

*Primary Examiner*—Quyen Leung
(74) *Attorney, Agent, or Firm*—Jean C. Edwards; Sonnenschein Nath & Rosenthal LLP

(57) ABSTRACT

A Gallium Nitride based Light Emitting Diode (LED) includes both a transparent substrate and a window for exiting light generated by the LED. Useful amounts of light may be utilized at the face of the window or at the face of the transparent substrate. An external optical reflector is formed directly on the external face of the LED which is not currently being used to exit useful light. If light from the window is being utilized, a Distributed Bragg Reflector (DBR) is formed directly on the "backside" of the substrate. However, if light through the substrate is being utilized, a Distributed Bragg Reflector is formed directly on the light emitting portion of the window.

4 Claims, 1 Drawing Sheet

TRANSPARENT SUBSTRATE LIGHT EMITTING DIODE

BACKGROUND OF THE INVENTION

A semiconductor light-emitting diode (LED) includes a substrate; a light emitting region; and a pair of electrodes for powering the diode. The substrate may be opaque or transparent. Light emitting diodes which are based on gallium nitride compounds generally include a transparent, insulating substrate, i.e., a sapphire substrate. With a transparent substrate, light may be utilized from either the substrate or from the opposite end of the LED which is termed the "window".

The magnitude of the light emitted by an LED depends on: (a) the percent of the light emitting region that is activated by current flowing between the electrodes; (b) the efficiency of the window structure; and (c) the internal losses of generated light.

If the light that exits through the window is being utilized, some of the light directed to and through the transparent substrate is lost. Similarly, if the light that exits through the substrate is being utilized, some of the light directed to and through the window is lost.

SUMMARY OF THE INVENTION

An LED having a transparent substrate which is consistent with the present invention, includes an external optical reflector formed directly on the face of the LED which is not being used to exit useful light. If light from the window is being utilized, a reflector is formed directly on the "backside" of the substrate. However, if light through the substrate is being utilized, a reflector is formed directly on the light-emitting portion of the window.

In accordance with this invention, a Distributed Bragg Reflector (DBR) may be formed on either the backside of the substrate or on the window. Advantageously the light emitted is increased by 50 to 100 percent.

DETAILED DESCRIPTION OF THE PREFERRED EMBODIMENTS

Figure 1:
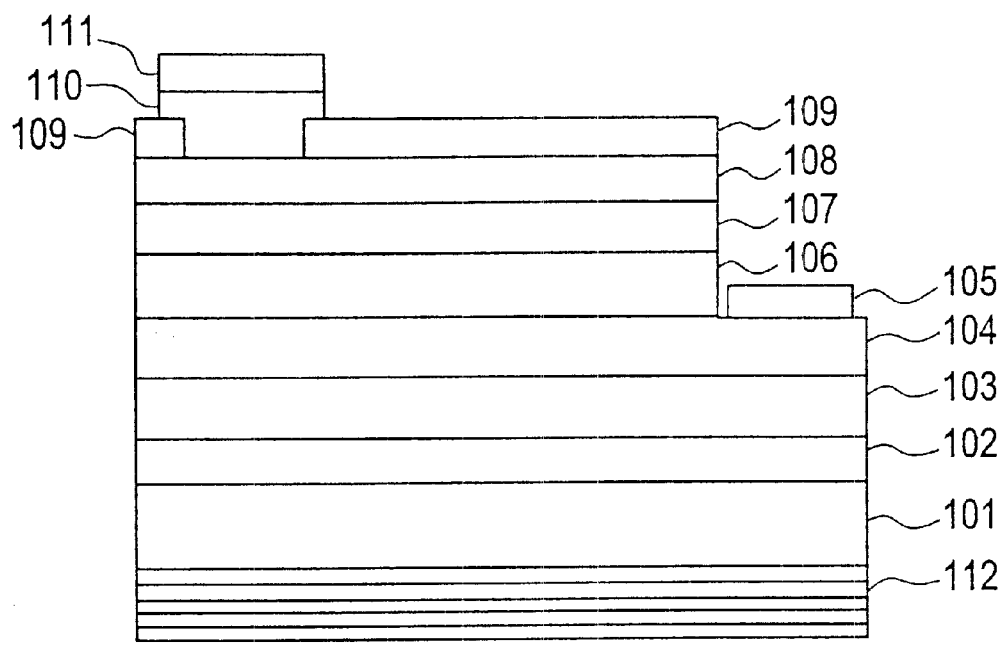
FIG. 1 depicts a side view of one embodiment of an LED consistent with the present invention.
Figure 2:
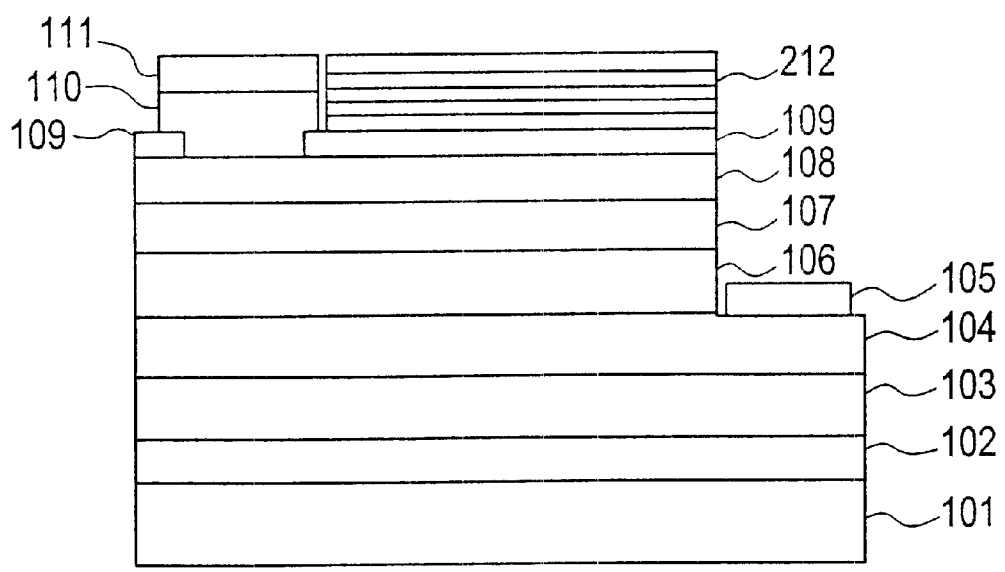
FIG. 2 depicts a side view of another embodiment of an LED consistent with the present invention.

The illustrative LEDs of FIGS. 1 and 2 are gallium nitride (GaN) based devices. The devices of FIGS. 1 and 2 differ only in the placement of the reflectors 112 and 212. In FIG. 1, the window 109 is utilized for the exit of light; and the reflector 112 is formed on the backside of substrate 101. In FIG. 2, the transparent substrate 101 is utilized for the exit of light; and the reflector 212 is formed on the window 109. The elements of FIG. 2 which correspond to the elements of FIG. 1 bear the same reference numerals.

The LED of FIGS. 1 and 2 includes: a sapphire substrate 101; buffer region 102, GaN substitute substrate layer 103; N cladding layer 104; active region 106; P cladding layer 107; window layers 108 and 109; N electrode 105; and P contact assembly 110 and 111.

In FIG. 1, light exits through window 109 and the Distributed Bragg Reflector (DBR) 112 is formed on the backside of the substrate 101.

Layers 101 through 104, and layers 106 through 109 are grown in a Metal Organic Chemical Vapor Deposition (MOCVD) reactor. The details of MOCVD growth of the stated layers are well known in the industry and will not be discussed herein.

The remaining components of the illustrative LED, namely, adhesion pad 110, P bond pad 111, and N bond pad 105 are formed by evaporation in apparatus other than a MOCVD reactor. Such processes are well known in the prior art and are not described herein.

The details of the construction of the illustrative embodiments of the LED of FIG. 1 are well known in the art and not discussed herein. The embodiments consistent with the present invention are applicable to any light emitting diode that has a transparent substrate i.e., sapphire substrate 101; and where light generated in the active region i.e., region 106, reaches and passes through substrate 101.

The DBR reflectors, 112 and 212, are each designed to provide reflection of light of a range of wavelengths arriving at a range of incident angles. Each DBR includes a number of pairs of layers to achieve the planned optical characteristics.

The layers of a DBR, e.g., DBR 112, are fabricated in an evaporation chamber by alternating the source materials which are deposited first on the backside of substrate 101, and progressively on the grown layers. Growth of the layers of DBR 212 on layer 109 follows the same process The invention has been described with particular attention to its preferred embodiment; however, it should be understood that variations and modifications within the spirit and scope of the invention may occur to those skilled in the art to which the invention pertains. For example, suitable layers of reflective metals may be substituted for the DBRs.

What is claimed is:

1. A light emitting diode comprising:
   a substrate,
   a light emitting region, and
   a light emitting window; and
   a reflector mounted directly on an external surface of an opposite of a light exiting exposed face of one of said substrate and said light emitting window.

2. The light emitting diode in accordance with claim 1, wherein said substrate is transparent.

3. A light emitting diode comprising:
   a substrate,
   a light emitting region;
   a light emitting window; and
   a reflector mounted directly on an external surface of an opposite of a light exiting exposed face of one of said substrate and said light emitting window;
   wherein said reflector comprises a Distributed Bragg Reflector (DBR).

4. A light emitting diode comprising:
   a substrate,
   a light emitting region;
   a light emitting window; and
   a reflector mounted directly on an external surface of an opposite of a light exiting exposed face of one of said substrate and said light emitting window;
   wherein said reflector comprises a Distributed Bragg Reflector (DBR);
   wherein said light emitting diode is constructed to generate light having a selected optical characteristic; and
   wherein said DBR is formed to accommodate to said selected optical characteristic.

* * * * *